(12) United States Patent
Shin et al.

(10) Patent No.: US 10,886,480 B2
(45) Date of Patent: Jan. 5, 2021

(54) FLEXIBLE DISPLAY DEVICE AND METHOD OF MANUFACTURING FLEXIBLE DISPLAY DEVICE

(71) Applicant: Samsung Display Co., Ltd., Yongin-si (KR)

(72) Inventors: Heekyun Shin, Incheon (KR);
Taewook Kang, Seongnam-si (KR);
Seungjun Moon, Cheonan-si (KR);
Woojin Cho, Yongin-si (KR);
Jeongmin Park, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/248,974

(22) Filed: Jan. 16, 2019

(65) Prior Publication Data
US 2019/0237688 A1  Aug. 1, 2019

(30) Foreign Application Priority Data

Jan. 31, 2018 (KR) .................. 10-2018-0012140

(51) Int. Cl.
| | |
|---|---|
| *H01L 51/00* | (2006.01) |
| *H01L 27/32* | (2006.01) |
| *H01L 51/56* | (2006.01) |
| *C09J 5/00* | (2006.01) |
| *C09J 7/38* | (2018.01) |

(Continued)

(52) U.S. Cl.
CPC ............ *H01L 51/0097* (2013.01); *C09J 5/00* (2013.01); *C09J 7/20* (2018.01); *C09J 7/22* (2018.01); *C09J 7/38* (2018.01); *H01L 27/3244* (2013.01); *H01L 51/003* (2013.01); *H01L 51/56* (2013.01); *C09J 2203/326* (2013.01); *C09J 2400/123* (2013.01); *H01L 51/5253* (2013.01);
(Continued)

(58) Field of Classification Search
None
See application file for complete search history.

(56) References Cited

U.S. PATENT DOCUMENTS

| | | | |
|---|---|---|---|
| 2013/0248828 A1* | 9/2013 | Schaepkens | ........ H01L 51/0097 257/40 |
| 2015/0021631 A1 | 1/2015 | Huh et al. | |

(Continued)

FOREIGN PATENT DOCUMENTS

| | | |
|---|---|---|
| KR | 10-2014-0100853 A | 8/2014 |
| KR | 10-2014-0110562 A | 9/2014 |

(Continued)

*Primary Examiner* — Asok K Sarkar
(74) *Attorney, Agent, or Firm* — Kile Park Reed & Houtteman PLLC

(57) ABSTRACT

A method of manufacturing a flexible display device includes forming a graphene adhesive layer on a carrier substrate, forming a flexible substrate on the graphene adhesive layer, forming a first barrier layer on the flexible substrate, forming a display element part on the first barrier layer, forming a protective film on the display element part, separating the flexible substrate from the carrier substrate, removing a remaining portion of the graphene adhesive layer from a surface of the flexible substrate, and forming a second barrier layer on the surface of the flexible substrate, after removing the remaining portion of the graphene adhesive layer from the surface of the flexible substrate.

4 Claims, 15 Drawing Sheets

(51) Int. Cl.
  *C09J 7/22* (2018.01)
  *C09J 7/20* (2018.01)
  *H01L 51/52* (2006.01)
(52) U.S. Cl.
  CPC .. *H01L 2227/326* (2013.01); *H01L 2251/301* (2013.01); *H01L 2251/5338* (2013.01)

(56) References Cited

U.S. PATENT DOCUMENTS

2015/0195915 A1    7/2015  Namkung
2019/0319077 A1*  10/2019  Miyamoto .......... H01L 51/5088

FOREIGN PATENT DOCUMENTS

| KR | 10-2015-0009289 A | 1/2015 |
| KR | 10-2015-0029045 A | 3/2015 |
| KR |    10-1530378 B1  | 6/2015 |
| KR | 10-2016-0125584 A | 11/2016 |
| KR | 10-2018-0043453 A | 4/2018 |

* cited by examiner

FLEXIBLE DISPLAY DEVICE AND METHOD OF MANUFACTURING FLEXIBLE DISPLAY DEVICE

CROSS-REFERENCE TO RELATED APPLICATION

Korean Patent Application No. 10-2018-0012140, filed on Jan. 31, 2018, in the Korean Intellectual Property Office, and entitled: "Flexible Display Device and Method of Manufacturing Flexible Display Device," is incorporated by reference herein in its entirety.

BACKGROUND

1. Field

Exemplary embodiments relate to a display device. More particularly, exemplary embodiments relate to a flexible display device and a method of manufacturing a flexible display device.

2. Description of the Related Art

Recently, research and development are being conducted to improve portability and variability of a flexible display device and to implement various designs. In order to obtain the flexible display device, a polymer substrate having flexibility may be used. For example, after a carrier substrate is combined with the polymer substrate, a display element part may be formed on the polymer substrate. Thereafter, the carrier substrate may be separated from the polymer substrate to form the flexible display device.

SUMMARY

According to an exemplary embodiment, a method of manufacturing a flexible display device is provided. In the method, a graphene adhesive layer is formed on a carrier substrate. A flexible substrate is formed on the graphene adhesive layer. A first barrier layer is formed on the flexible substrate. A display element part is formed on the first barrier layer. A protective film is formed on the display element part. The flexible substrate is separated from the carrier substrate. A remaining portion of the graphene adhesive layer is removed from a surface of the flexible substrate. A second barrier layer is formed on the surface of the flexible substrate after the remaining portion of the graphene adhesive layer is removed from the surface of the flexible substrate.

In an exemplary embodiment, an edge of the graphene adhesive layer is removed to expose an upper surface of the carrier substrate before the flexible substrate is formed.

In an exemplary embodiment, an edge of the flexible substrate contacts the carrier substrate.

In an exemplary embodiment, in order to form the graphene adhesive layer, a first graphene oxide layer charged with a first electric charge is formed. A second graphene oxide layer is formed on the first graphene oxide layer. The second graphene oxide layer is charged with a second electric charge opposite to the first electric charge.

In an exemplary embodiment, a solution including a graphene oxide charged with the first electric charge or the second electric charge is coated to form the first and second graphene oxide layers.

In an exemplary embodiment, the graphene adhesive layer is formed through chemical vaporization deposition.

In an exemplary embodiment, the chemical vaporization deposition for forming the graphene adhesive layer uses a mask covering an edge of the carrier substrate.

In an exemplary embodiment, a cutting portion is formed at the flexible substrate, before the flexible substrate is separated from the carrier substrate, wherein the cutting portion overlaps the graphene adhesive layer.

In an exemplary embodiment, the cutting portion has a shape surrounding the display element part in a plan view.

In an exemplary embodiment, in order to separate the flexible substrate from the carrier substrate, the protective film is absorbed to a fixing stage. The carrier substrate is absorbed to a fixing member. The flexible substrate and the carrier substrate are bent to adsorb an edge of the flexible substrate to the fixing stage. An external force is applied to the flexible substrate and the carrier substrate in opposite directions, respectively.

In an exemplary embodiment, the second barrier layer includes silicon oxycarbide (SiOC).

In an exemplary embodiment, in order to form the second barrier layer, an interfacial layer including silicon oxycarbide and contacting the flexible substrate is formed. An outer layer including at least one of silicon oxide, silicon nitride and silicon oxynitride is formed on the interfacial layer In an exemplary embodiment, the first barrier layer includes a multiple-layer structure of silicon oxide ($SiO_2$)/silicon nitride (SiN)/silicon oxynitride (SiON).

In an exemplary embodiment, the flexible substrate includes at least one of polyester, polyvinyl, polycarbonate, polyethylene, polypropylene, polyacetate, polyimide, polyethersulphone (PES), polyacrylate (PAR), polyethylenenaphthelate (PEN) and polyethyleneterephehalate (PET).

In an exemplary embodiment, the carrier substrate includes at least one of glass, quartz, silicon and a polymer.

According to an exemplary embodiment, a flexible display device includes a flexible substrate, a first barrier layer disposed on a first surface of the flexible substrate, a display element part disposed on the first barrier layer and a second barrier layer disposed on a second surface of the flexible substrate, which is opposite to the first surface, and including silicon oxycarbide.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
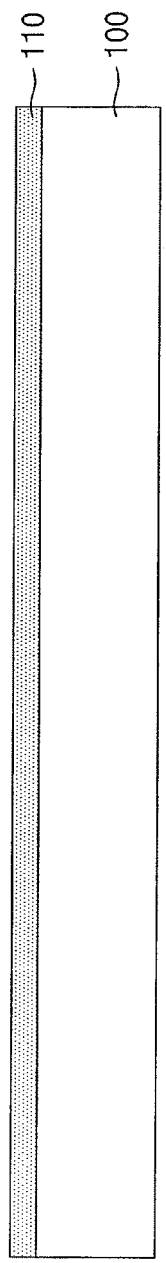
FIGS. 1 to 6 and 8 to 12 illustrate cross-sectional views of stages in a method of manufacturing a flexible display device according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

A method of manufacturing a flexible display device according to exemplary embodiments will be described hereinafter with reference to the accompanying drawings, in which some exemplary embodiments are shown.

FIGS. 1 to 6 and 8 to 12 are cross-sectional views illustrating a method of manufacturing a flexible display device according to an exemplary embodiment. FIG. 7 is a plan view illustrating a cutting process in a method of manufacturing a flexible display device according to an exemplary embodiment. FIG. 13 is an enlarged cross-sectional view illustrating region 'A' of FIG. 12.

Referring to FIG. 1, a graphene adhesive layer 110 is formed on a carrier substrate 100.

The carrier substrate 100 supports a flexible substrate 200 (FIG. 3) in the process of manufacturing a flexible display device. For example, the carrier substrate 100 may include glass, quartz, silicon, polymers or the like.

The graphene adhesive layer 110 may include graphene or graphene oxide. In an exemplary embodiment, the graphene adhesive layer 110 may include graphene oxide. Graphene oxide has physical characteristics similar to those of graphene and has superior dispersion ability. Thus, an aqueous solution process may be used for forming a thin layer of the graphene adhesive layer 110 on the carrier substrate 100.

In an exemplary embodiment, the graphene adhesive layer 110 may be formed through a layer-by-layer method. For example, the graphene adhesive layer 110 may be formed by alternately depositing a first graphene oxide layer, which is charged with a first electric charge, and a second graphene oxide layer, which is charged with a second electric charge opposite to the first electric charge. The first electric charge is one of a negative electric charge and a positive electric charge, and the second electric charge is the other one of the negative electric charge and the positive electric charge. The graphene oxide layers charged with different electric charges may be interlayer-combined with each other by Coulomb's force (electrostatic force).

For example, the graphene oxide may contain a carboxylic group, a hydroxyl group or the like. Thus, the graphene oxide may have a negative electric charge. In another example, the graphene oxide may contain an oxidation agent or a reduction agent to obtain graphene oxide charged with a negative electric charge or a positive electric charge. For example, in order to obtain a graphene oxide charged with a positive electric charge, a metal salt, e.g., magnesium salt, nickel salt or the like, may be provided to the graphene oxide, or the graphene oxide may be modified with a polymer, e.g., polyethylene glycol.

In an exemplary embodiment, before the graphene oxide layer 110 is formed, the carrier substrate 100 may be surface-treated so that a surface of the carrier substrate 100 may be charged with a negative electric charge or a positive electric charge. For example, the surface of the carrier substrate 100 may be charged with an electric charge opposite to that in the first graphene oxide layer to be deposited directly on the carrier substrate 100.

For example, before the first graphene oxide layer charged with a negative electric charge is formed, a surface of the carrier substrate 100 may be charged with a positive electric charge. For example, in order to charge the surface of the carrier substrate 100 with a positive electric charge, the surface of the carrier substrate 100 may be treated with a cationic polymer electrolyte, e.g., poly(allylamine)hydrochloride (PAH), polydiallyldimethylammonium (PDDA) or poly(ethyleneimine) (PEI), or treated with plasma of an inert gas, e.g., argon.

In another example, before the first graphene oxide layer charged with a positive electric charge is formed, a surface of the carrier substrate 100 may be charged with a negative electric charge. For example, in order to charge the surface of the carrier substrate 100 with a negative electric charge, the surface of the carrier substrate 100 may be treated with an anionic polymer electrolyte, e.g., poly(4-styrene-sulfonate) (PSS) or poly(acrylic)acid (PAA), sulfuric acid/hydrogen peroxide, oxygen plasma or the like. In an exemplary embodiment, after the surface of the carrier substrate 100 is charged with a negative electric charge, the surface of the carrier substrate 100 may be further treated with the anionic polymer electrolyte.

For example, after the surface of the carrier substrate 100 is positively charged, an aqueous solution of negatively charged graphene oxide is coated, e.g., directly, on the positively charged surface of the carrier substrate 100 to form a thin film of graphene oxide on the surface of the carrier substrate 100. For example, the aqueous solution of graphene oxide may be coated through a dip coating method, a spray coating method, a spin coating method, a screen coating method, an offset printing method, an inkjet printing method, a knife coating method, a gravure coating method or the like.

The negatively charged graphene oxide may be combined with the positively charged surface of the carrier substrate 100 by Coulomb's force. When the surface of the carrier substrate 100 is entirely covered with the graphene oxide, a thickness of the resultant thin film of the graphene oxide is very small, e.g., barely increased relatively to the carrier substrate 100, because of an electrostatic repulsive force between graphene oxide particles. Thus, a resultant graphene oxide layer having a very small thickness may be formed, i.e., the first graphene oxide layer may be directly on the carrier substrate 100. Thereafter, drying and rinsing may be performed. As a result, the first graphene oxide layer charged with a negative electric charge may be formed, e.g., directly, on the carrier substrate 100.

Thereafter, an aqueous solution of graphene oxide charged with a positive electric charge is coated, e.g., directly, on the negatively charged first graphene oxide layer. The graphene oxide charged with the positive electric charge may be combined with the negatively charged first graphene oxide layer to form a second graphene oxide layer charged with a positive electric charge.

The above steps may be repeated to form the graphene adhesive layer 110 including a plurality of graphene oxide layers charged with opposite charges, e.g., the first and second graphene oxide layers may be stacked on top of each other to form the graphene adhesive layer 110. The graphene adhesive layer 110 has superior barrier ability, thereby preventing a strong chemical bond from being formed between the flexible substrate 200 (to be formed subsequently) and the carrier substrate 100 due to inflow of a deposition source, e.g., silane, in the process of forming the display element part. Furthermore, the graphene adhesive layer 110 has a relatively low adhesion force compared to other adhesives. Thus, after a display element part is formed, the carrier substrate 100 may be easily separated from the flexible substrate 200.

For example, a thickness of the combined first and second graphene oxide layers may be about 3 nm to about 30 nm. Sequential deposition of the first and second graphene oxide layers, i.e., the negatively charged graphene oxide layer and the positively charged graphene oxide layer, may be repeated 1 to 10 times, so a total thickness of the graphene adhesive layer 110 may be about 3 nm to 150 nm.

Figure 2:
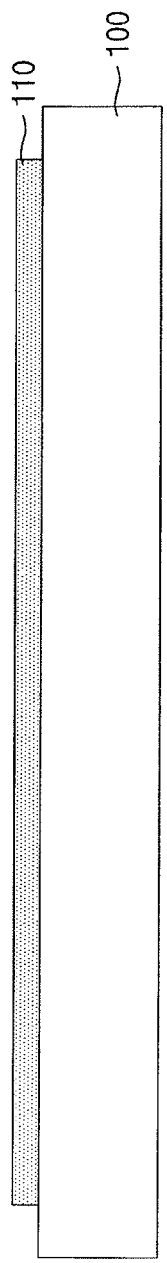

Referring to FIG. 2, an edge of the graphene adhesive layer 110 is removed from the carrier substrate 100 to partially expose an upper surface of the carrier substrate 100. For example, a plasma torch may be used, or an alkali material, e.g., tetramethylammonium hydroxide (TMAH) may be applied, in order to pattern the graphene adhesive layer 110.

In detail, the edge of the graphene adhesive layer 110 is removed to partially expose an upper surface of the carrier substrate 100 so that an edge of the flexible substrate 200, which will be subsequently formed on the graphene adhesive layer 110, may, e.g., directly, contact the exposed upper surface of the carrier substrate 100. If the graphene adhesive layer 110 has a shape already partially exposing the upper surface of the carrier substrate 100, e.g., as will be described later with reference to FIGS. 14-15, removal of the edge of the graphene adhesive layer 110 may be omitted.

Thereafter, the graphene adhesive layer 110 may be baked. Through baking, a solvent remaining in the graphene adhesive layer 110 may be removed, and a density of the graphene adhesive layer 110 may be increased, e.g., so the total thickness of the deposited graphene adhesive layer 110 may be reduced after baking. For example, a temperature for the baking process may be about 300° C. to about 500° C. For example, an adhesion force of the graphene adhesive layer 110 may be about 1 gf/in to about 5 gf/in.

Figure 3:
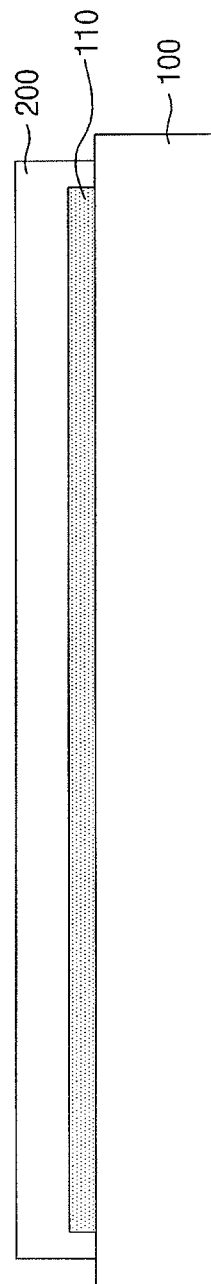

Referring to FIG. 3, the flexible substrate 200 is formed on the graphene adhesive layer 110.

For example, a composition including a polymer or a monomer capable of forming a polymer may be coated on the graphene adhesive layer 110, and then dried or cured to form the flexible substrate 200. For example, the flexible substrate 200 may include polyester, polyvinyl, polycarbonate, polyethylene, polypropylene, polyacetate, polyimide, polyethersulphone (PES), polyacrylate (PAR), polyethylenenaphthelate (PEN), polyethyleneterephehalate (PET), or a combination thereof. In an exemplary embodiment, the flexible substrate 200 may include polyimide, which has superior mechanical characteristics and heat resistance.

In an exemplary embodiment, an edge of the flexible substrate 200 contacts, e.g., directly contacts, the carrier substrate 100. Thus, a side surface of the graphene adhesive layer 110 may be covered by the flexible substrate 200, e.g., the flexible substrate 200 may directly cover a top surface and at least some of the lateral surfaces of the graphene adhesive layer 110 to directly contact the carrier substrate 100. If the flexible substrate 200 were to be entirely spaced apart from the carrier substrate 100 by the graphene adhesive layer 110 (i.e., without direct contact between the flexible substrate 200 and the carrier substrate 100), in the process of forming the display element part, the flexible substrate 200 would be separated from or dislocated relatively to the carrier substrate 100 due to the low adhesive force of the graphene adhesive layer 110.

Figure 4:
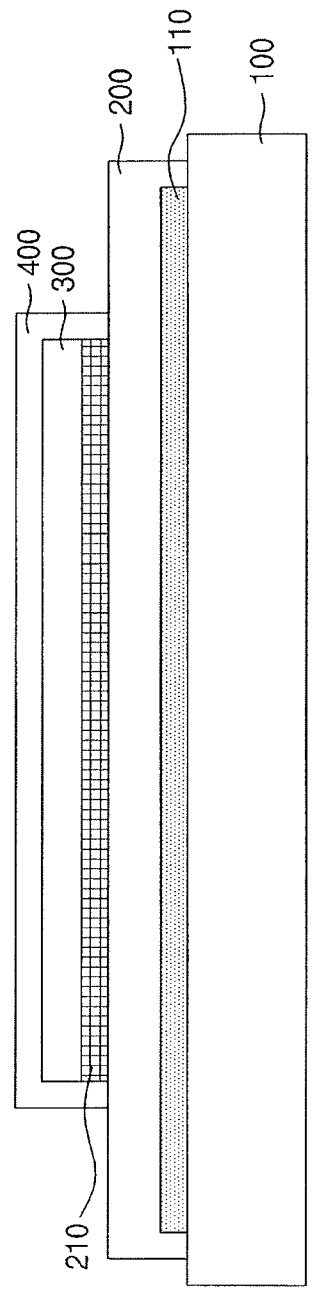

Referring to FIG. 4, a first barrier layer 210 is formed on the flexible substrate 200. A display element part 300 and a protective film 400 protecting the display element part 300 are formed on the first barrier layer 210.

The first barrier layer 210 may prevent external impurities from penetrating into the display element part 300. For example, the first barrier layer 210 may include an inorganic material. For example, the inorganic material may include silicon oxide, silicon nitride, silicon oxynitride, silicon carbide, silicon oxycarbide or a combination thereof. The first barrier layer 210 may have a single-layer structure or a multi-layer structure including a plurality of layers including different materials.

In an exemplary embodiment, the first barrier layer 210 may include a multi-layer structure of silicon oxide ($SiO_2$)/silicon nitride (SiN)/silicon oxynitride (SiON). For example, a thickness of a silicon oxide layer may be about 2,000 angstroms to about 10,000 angstroms, a thickness of a silicon nitride layer may be about 100 angstroms to about 1,000 angstroms, and a thickness of a silicon oxynitride layer may be about 2,000 angstroms to about 10,000 angstroms. The multi-layer structure may effectively prevent or inhibit penetration of humidity or particles.

For example, the first barrier layer 210 may be formed through chemical vaporization deposition (CVD), plasma-enhanced chemical vaporization deposition (PECVD), physical deposition, atomic layer deposition (ALD) or the like.

The first barrier layer 210 is shown to entirely cover a surface of the flexible substrate 200 in the drawing, however, exemplary embodiments are not limited thereto. For example, the first barrier layer 210 may be formed only on a portion of the flexible substrate 200.

Figure 5:
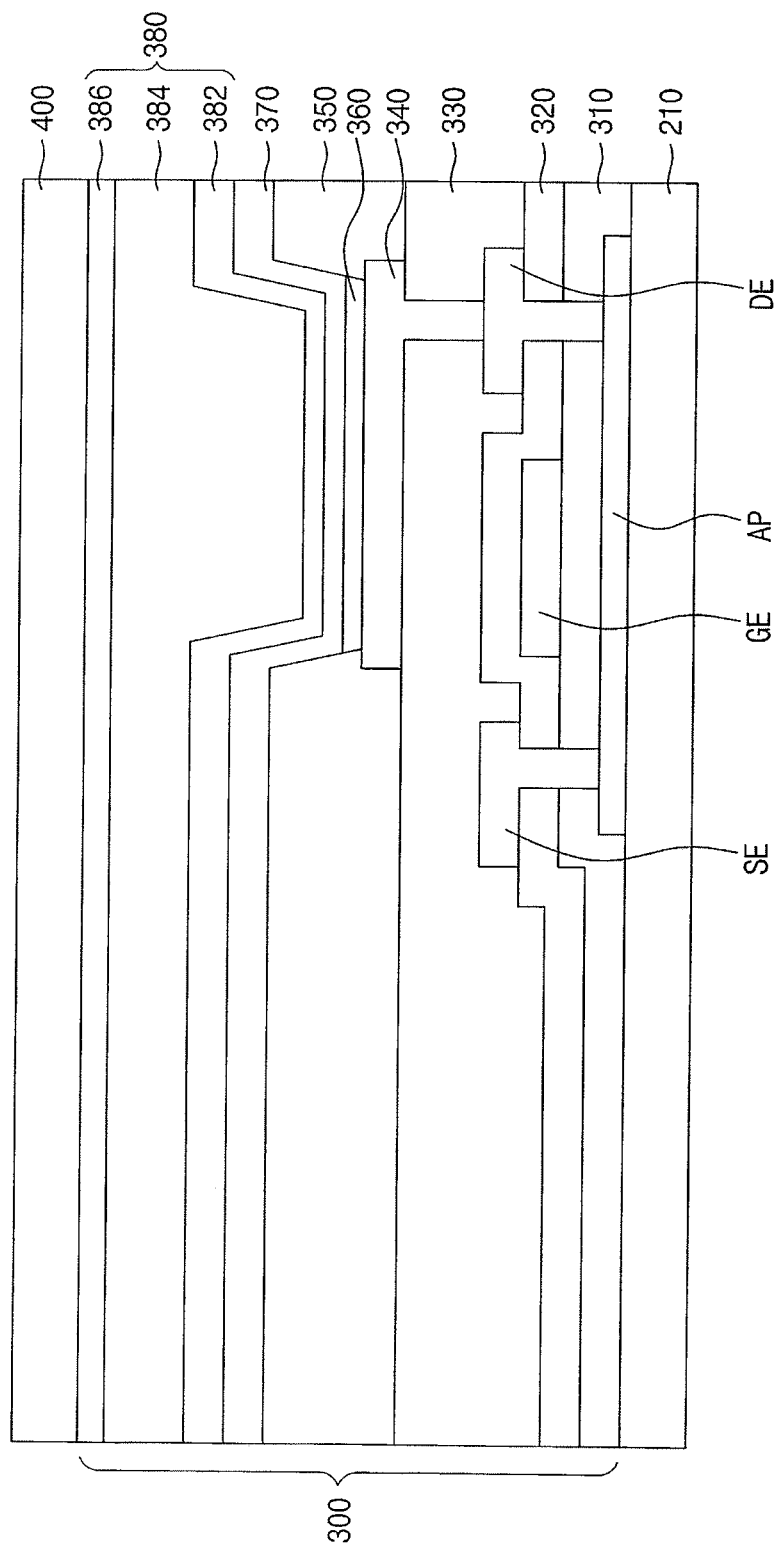

FIG. 5 is an enlarged cross-sectional view illustrating the display element part 300 according to an exemplary embodiment.

Referring to FIG. 5, the display element part 300 may include a pixel circuit, an organic light-emitting diode electrically connected to the pixel circuit, and a thin film encapsulation layer covering the organic light-emitting diode.

The pixel circuit may include an active pattern AP, a gate electrode GE overlapping the active pattern AP, a source electrode SE electrically connected to the active pattern AP, and a drain electrode DE spaced apart from the source electrode SE and electrically connected to the active pattern AP.

The active pattern AP may be disposed on the first barrier layer 210. The active pattern AP may overlap the gate electrode GE. For example, the active pattern AP may include a semiconductor material, e.g., amorphous silicon, polycrystalline silicon (polysilicon), oxide semiconductor or the like. For example, when the active pattern AP includes polysilicon, at least a portion of the active pattern AP may be doped with impurities, e.g., n-type impurities or p-type impurities.

A first insulation layer 310 may be disposed on the active pattern AP. For example, the first insulation layer 310 may include silicon oxide, silicon nitride, silicon oxynitride, silicon carbide, silicon oxycarbide or a combination thereof. Furthermore, the first insulation layer 310 may include an insulating metal oxide, e.g., aluminum oxide, tantalum oxide, hafnium oxide, zirconium oxide, titanium oxide or the like. For example, the first insulation layer 310 may have a single-layer structure or a multiple-layer structure including silicon nitride and/or silicon oxide.

The gate electrode GE may be disposed on the first insulation layer 310. For example, the gate electrode GE may include gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta) or an alloy thereof, and may have a single-layer structure or a multiple-layer structure including different metal layers.

A second insulation layer 320 may be disposed on the gate electrode GE and the first insulation layer 310. For example, the second insulation layer 320 may include silicon oxide, silicon nitride, silicon oxynitride, silicon carbide, silicon oxycarbide or a combination thereof. Furthermore, the second insulation layer 320 may include an insulating metal oxide, e.g., aluminum oxide, tantalum oxide, hafnium oxide, zirconium oxide, titanium oxide or the like.

A data metal pattern including the source electrode SE and the drain electrode DE may be disposed on the second insulation layer 320. The source electrode SE and the drain electrode DE may pass through the first insulation layer 310 and the second insulation layer 320 to contact the active pattern AP, respectively. For example, the source electrode SE and the drain electrode DE may include gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta) or an alloy thereof, and may have a single-layer structure or a multiple-layer structure including different metal layers.

A third insulation layer 330 may be disposed on the data metal pattern and the second insulation layer 320. For example, the third insulation layer 330 may include an inorganic insulation material, an organic insulation material or a combination thereof. For example, the organic insulation material may include polyimide, polyamide, acrylic resin, phenol resin, benzocyclobutene (BCB) or the like.

A first electrode 340 of the organic light-emitting diode may be disposed on the third insulation layer 330. In an exemplary embodiment, the first electrode 340 may function as an anode. For example, the first electrode 340 may be formed as a transmitting electrode or a reflecting electrode according to an emission type of the display device. When the first electrode 340 is a transmitting electrode, the first electrode 340 may include, e.g., indium tin oxide, indium zinc oxide, zinc tin oxide, indium oxide, zinc oxide, tin oxide or the like. When the first electrode 340 is a reflecting electrode, the first electrode 340 may include, e.g., gold (Au), silver (Ag), aluminum (Al), copper (Cu), nickel (Ni), platinum (Pt), magnesium (Mg), chromium (Cr), tungsten (W), molybdenum (Mo), titanium (Ti) or a combination thereof, and may have a stack structure further including the material that may be used for the transmitting electrode.

A pixel-defining layer 350 may be disposed on the third insulation layer 330. The pixel-defining layer 350 may include an opening that exposes at least a portion of the first electrode 340. For example, the pixel-defining layer 350 may include an organic insulation material. For example, the pixel-defining layer 350 and the third insulation layer 330 may be formed by coating a photoresist composition including an organic insulation material and patterning a coating layer using exposure-development processes.

An organic light-emitting layer 360 may be disposed on the first electrode 340. A common layer 370 may be disposed on the organic light-emitting layer 360. The common layer 370 may include at least one layer extending continuously across a plurality of pixels in a display area.

In an exemplary embodiment, the organic light-emitting layer 360 may have a patterned shape disposed in an opening of the pixel-defining layer 350. However, exemplary embodiments are not limited thereto, and the organic light-emitting layer 360 may continuously extend across a plurality of pixels in a display area, like the common layer 370.

For example, the organic light-emitting layer 360 may include at least one of a hole injection layer (HIL), a hole transporting layer (HTL), a light-emitting layer, an electron transporting layer (ETL), and an electron injection layer (EIL). For example, the organic light-emitting layer 360 may include a low molecular weight organic compound or a high molecular weight organic compound.

In an exemplary embodiment, the organic light-emitting layer 360 may emit a red light, a green light, or a blue light. In another exemplary embodiment, the organic light-emitting layer 360 may emit a white light. The organic light-emitting layer 360 emitting a white light may have a multiple-layer structure including a red-emitting layer, a green-emitting layer, and a blue-emitting layer, or a single-layer structure including a mixture of a red-emitting material, a green-emitting material, and a blue-emitting material.

For example, the common layer 370 may include at least a second electrode of the organic light-emitting diode, and may further include a capping layer and/or a blocking layer on the second electrode.

In an exemplary embodiment, the second electrode of the common electrode layer 370 may function as a cathode. For example, the second electrode may be formed as a transmitting electrode or a reflecting electrode according to an emission type of the display device. For example, when the second electrode is a transmitting electrode, the second electrode may include, e.g., lithium (Li), calcium (Ca), lithium fluoride (LiF), aluminum (Al), magnesium (Mg), or a combination thereof, and the display device may further include a sub electrode or a bus electrode line, which includes, e.g., indium tin oxide, indium zinc oxide, zinc tin oxide, indium oxide, zinc oxide, tin oxide, or the like.

The capping layer of the common electrode layer 370 may be disposed on the second electrode. The capping layer may protect the organic light-emitting diode and may promote the light generated by the organic light-emitting diode to exit outwardly.

For example, the capping layer may include an inorganic material or an organic material. For example, the inorganic material may include zinc oxide, tantalum oxide, zirconium oxide, titanium oxide or the like. For example, the organic material may include poly(3,4-ethylenedioxythiophene), PEDOT), 4,4'-bis[N-(3-methylphenyl)-N-phenylamino]biphenyl (TPD), 4,4',4''-tris[(3-methylphenyl)phenylamino] triphenylamine (m-MTDATA), 1,3,5-tris[N,N-bis(2-methylphenyl)-amino]-benzene (o-MTDAB), 1,3,5-tris[N,N-bis (3-methylphenyl)-amino]-benzene (m-MTDAB) or the like.

The blocking layer of the common electrode layer 370 may be disposed on the capping layer. The blocking layer may prevent damage to the organic light-emitting diode by plasma or the like from later processes. For example, the blocking layer may include lithium fluoride, magnesium fluoride, calcium fluoride or the like.

The thin film encapsulation layer 380 may be disposed on the common layer 370. The thin film encapsulation layer 380 may have a stack structure of an inorganic layer and an organic layer. For example, the thin film encapsulation layer 380 may include a first inorganic layer 382, a second inorganic layer 386, and an organic layer 384 disposed between the first and second inorganic layers 382 and 386.

For example, the organic layer 384 may include a cured resin, e.g., polyacrylate or the like. For example, the cured resin may be formed from cross-linking reaction of monomers.

For example, the first and second inorganic layers 382 and 386 may include an inorganic material, e.g., silicon oxide, silicon nitride, silicon carbide, aluminum oxide, tantalum oxide, hafnium oxide, zirconium oxide, titanium oxide or the like, and may be formed by chemical vaporization deposition (CVD).

The organic layer 384 may be formed on the first inorganic layer 382. For example, a monomer composition may be provided on an upper surface of the first inorganic layer 382 to form the organic layer 384.

The monomer composition may include a curable monomer. For example, the curable monomer may contain at least one curable functional group. For example, the curable functional group may include a vinyl group, a (meth) acrylate group, an epoxy group or the like. For example, the curable monomer may include ethyleneglycol di(meth)acrylate, hexanediol di(meth)acrylate, heptanediol di(meth)acrylate, octanediol di(meth)acrylate, nonanediol di(meth)acrylate, decanediol di(meth)acrylate, triethylpropane tri(meth) acrylate, pentaerythritol tri(meth)acrylate, pentaerythritol tetra(meth)acrylate, dipentaerythritol tri(meth)acrylate, dipentaerythritol tetra(meth)acrylate, dipentaerythritol penta (meth)acrylate, dipentaerythritol hexa(meth)acrylate or the like. The monomer composition may further include an initiator such as a photo initiator or the like. The monomer composition may be provided on the first inorganic layer 382 through ink-jet printing, screen printing or the like, and may be cured to form the cured resin.

Exemplary embodiments are not limited to the above-explained configuration of the thin film encapsulation layer 380. For example, the thin film encapsulation layer 380 may include at least two organic layers or at least three inorganic layers.

The protective film 400 may cover an upper surface of the thin film encapsulation layer 380. For example, the protective film 400 may include a polymer film or the like.

Hereinafter, a process of separating the flexible substrate 200 from the carrier substrate 100 will be explained with reference to FIGS. 6 to 10.

Figure 6:
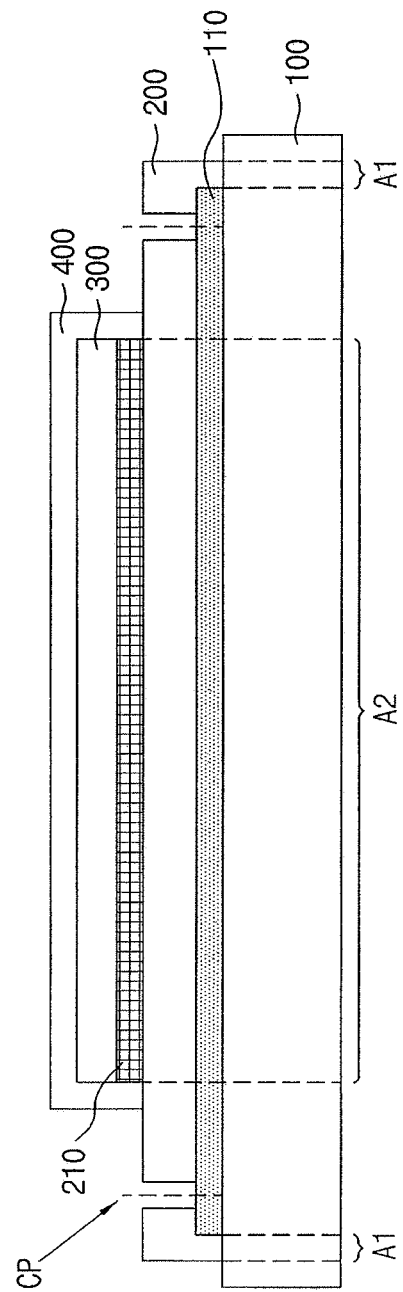
Figure 7:
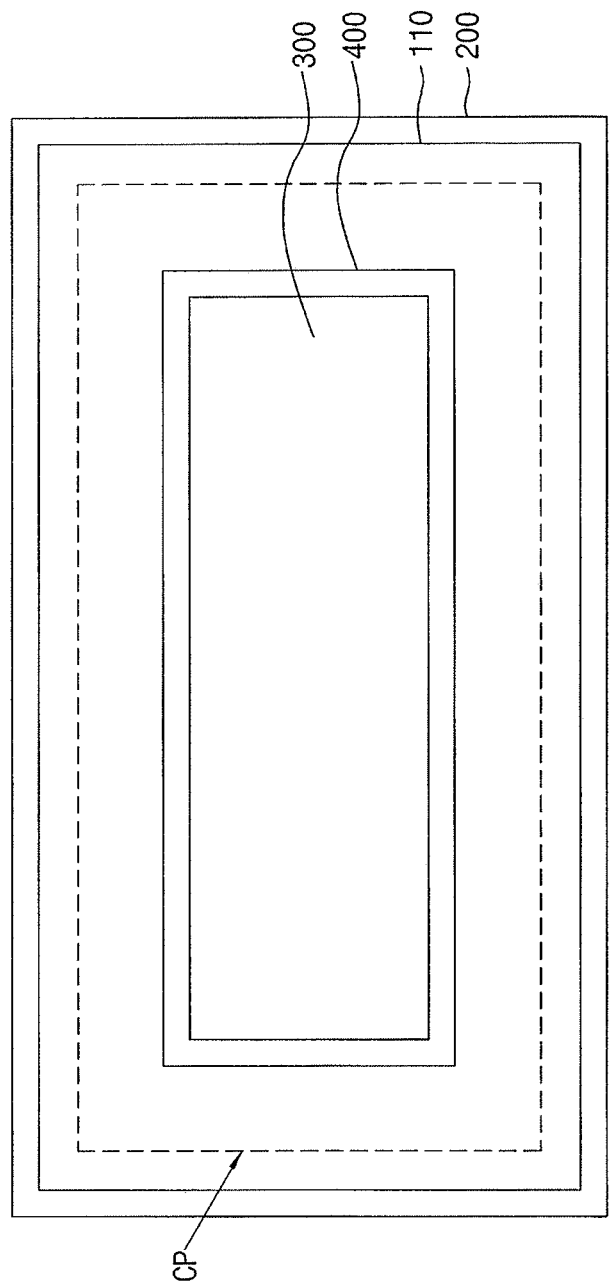
FIG. 7 illustrates a plan view of a cutting process in a method of manufacturing a flexible display device according to an exemplary embodiment.

Referring to FIGS. 6 and 7, a cutting portion CP is formed, e.g., defined, at an edge of the flexible substrate 200 (dashed line). For example, the cutting portion CP may be formed, e.g., defined, in an area where the flexible substrate 200 and the graphene adhesive layer 110 overlap each other. In an exemplary embodiment, a cutting line formed, e.g., defined, by the cutting portion CP may be disposed between an outer boundary of the graphene adhesive layer 110 and an outer boundary of the display element part 300, in a plan view (FIG. 7). For example, the flexible substrate 200 may be cut along the cutting line (dashed line in FIG. 7) surrounding the display element part 300 with a laser, a knife or the like, e.g., the flexible substrate 200 may be only partially cut to a predetermined depth along the dashed cutting line.

In an exemplary embodiment, a first area A1, i.e., an area where the carrier substrate 100 directly contacts the flexible substrate 200, and a second area A2, i.e., an area where the carrier substrate 100 overlaps the display element part 300, may be separated from each other by the cutting portion CP. For example, referring to FIGS. 6-7, the first area A1 may surround an entire perimeter of the second area A2. For example, the cutting portion CP may be formed, e.g., defined, anywhere between the first area A1 and the second area A2, e.g., around an entire perimeter of the second area A2, as illustrated in FIGS. 6-7.

When the first area A1 where the carrier substrate 100 directly contacts the flexible substrate 200 and the second area A2 overlapping the display element part 300 are separated from each other, the process of separating the carrier substrate 100 from flexible substrate 200 may be easily performed without interference by the strong bond between the carrier substrate 100 and flexible substrate 200. That is, since the strong bond between the carrier substrate 100 and the flexible substrate 200 exists only in the first area A1, removal of the edge of the flexible substrate 200 only in the first area A1 facilitates separation between the flexible substrate 200 and the carrier substrate 100 in the second area A2, as will be described in more detail below with reference to FIG. 10.

Figure 8:
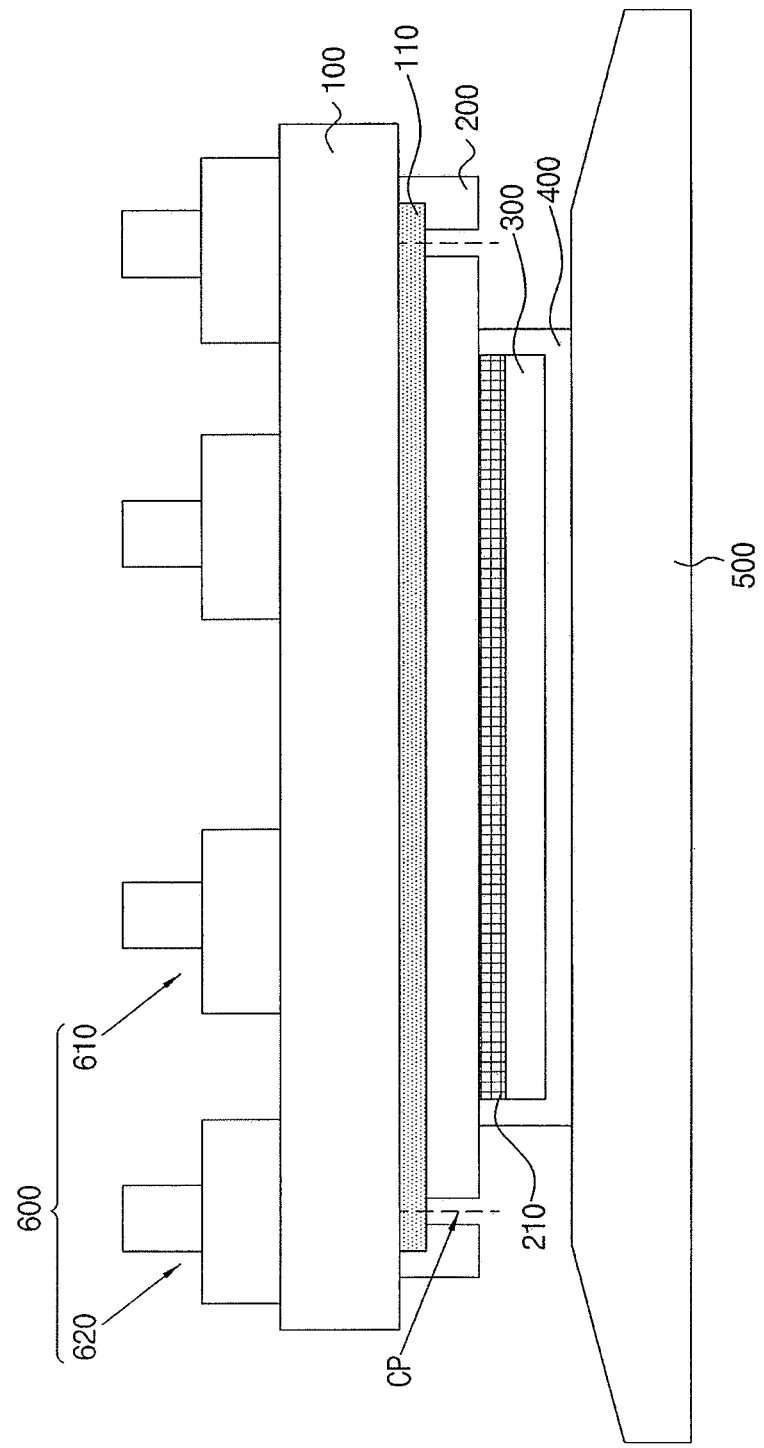

Referring to FIG. 8, the protective film 400 is combined with a fixing stage 500, and the carrier substrate 100 is combined with a fixing member 600. For example, vacuum or negative pressure may be provided to the fixing stage 500 and the fixing member 600 so that the fixing stage 500 and the fixing member 600 may be combined with the protective film 400 and the carrier substrate 100, respectively. For example, as illustrated in FIG. 8, the structure of FIG. 6 may be flipped upside-down before attachment of the fixing stage 500 and the fixing member 600 to the protective film 400 and the carrier substrate 100, respectively.

The fixing member 600 may include a plurality of fixing pads. For example, the fixing member 600 may include a first fixing member 610 combined with an area overlapping the display element part 300, and a second fixing member 620 combined with an area adjacent to, e.g., overlapping, the cutting portion CP. For example, as illustrated in FIG. 8, the second fixing member 620 may not overlap the display element part 300, e.g., the second fixing member 620 may be horizontally spaced apart from the display element part 300 to overlap an outermost edge of the flexible substrate 200, so an empty space may be defined between the second fixing member 620 and the fixing stage 500, e.g., the empty space may be external to the flexible substrate 200.

Figure 9:
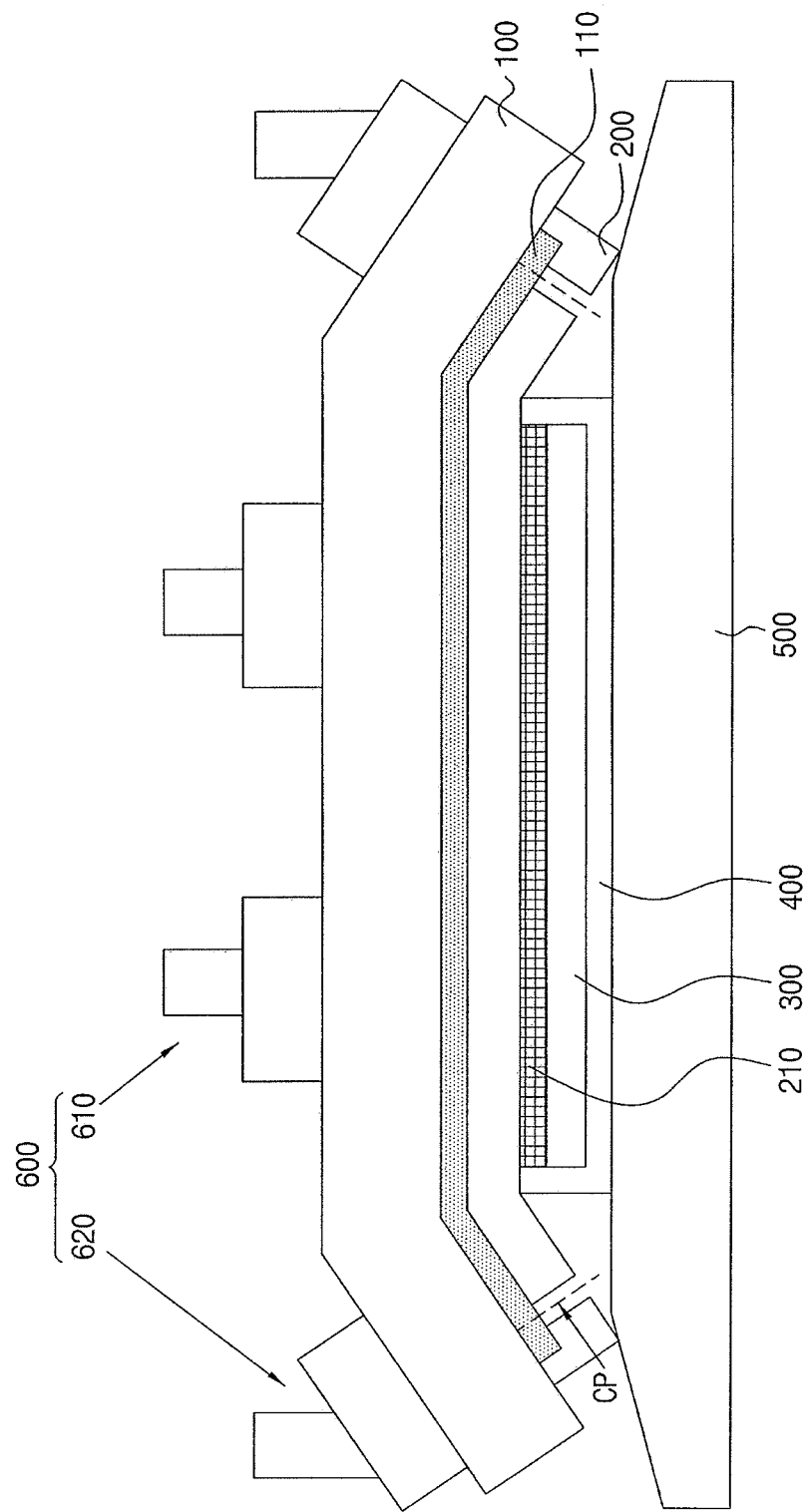
Figure 10:
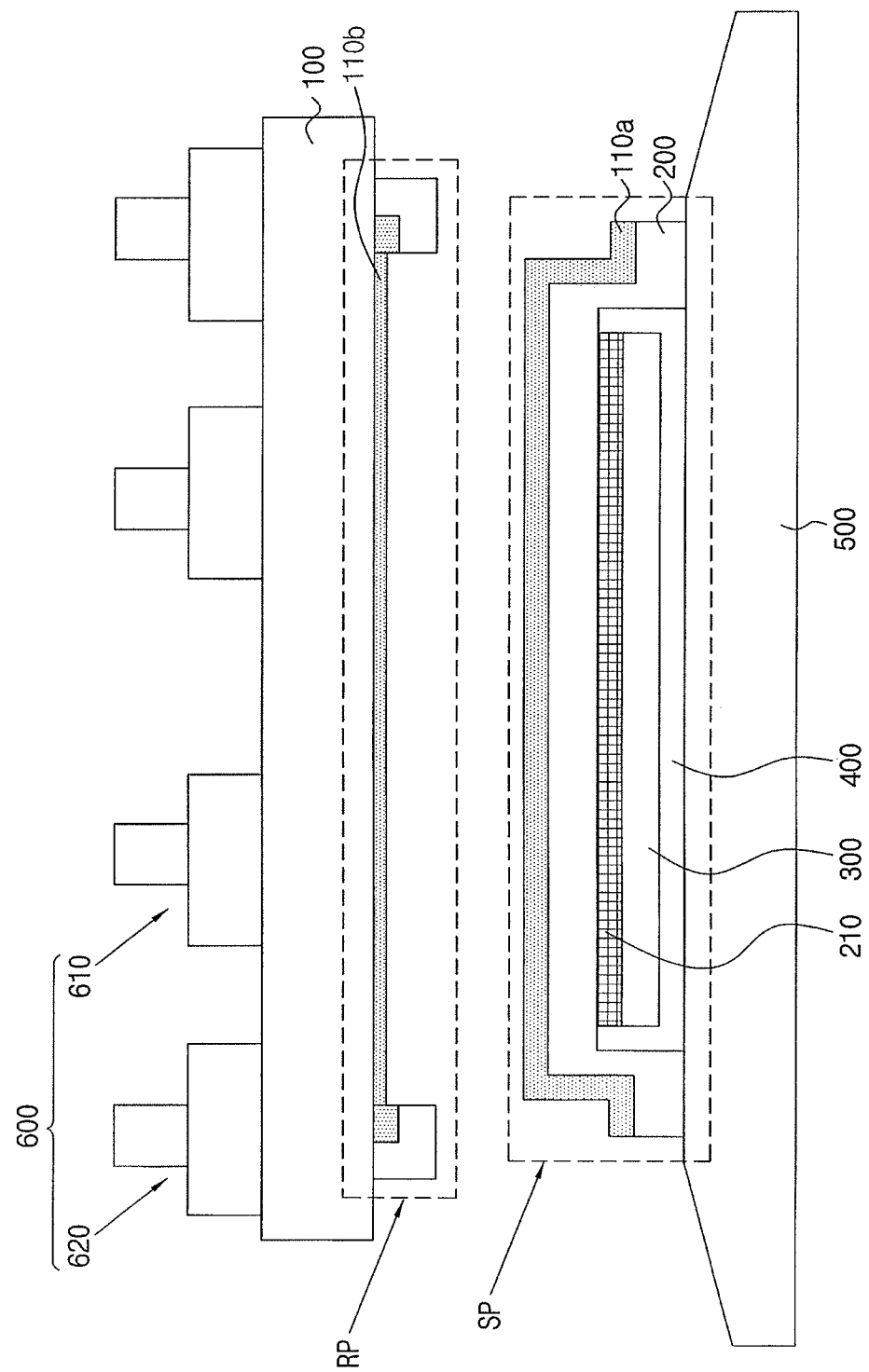

Referring to FIG. 9, the second fixing member 620 combined with the area adjacent to the cutting portion CP may move downwardly toward the fixing stage 500. For example, pressure may be applied to the second fixing member 620 to push the cutting portion CP downwardly toward the empty space, e.g., until the cutting portion CP contacts the fixing stage 500. Thus, an edge of the flexible substrate 200 may bend to contact the fixing stage 500. For example, the second fixing member 620 may be pushed toward the fixing stage 500 and toward lateral sides of the protective film 400 until a portion of the flexible substrate 200 is flush against the lateral sides of the protective film 400 (FIG. 10). Since the fixing stage 500 provides vacuum or negative pressure, the edge of the flexible substrate 200 may be adsorbed onto and combined with the fixing stage 500.

Referring to FIG. 10, the fixing member 600 combined with the carrier substrate 100 may move upwardly to separate the flexible substrate 200 from the carrier substrate 100, e.g., the first fixing member 610 may be pulled up relatively to the flexible substrate 200. When the fixing member 600 with the carrier substrate 100 is removed from the flexible substrate 200, the cutting portion CP remains on the carrier substrate 100, while the flexible substrate 200 with the graphene adhesive layer 110 remain on the fixing stage 500. It is noted that a portion of the flexible substrate 200 with the graphene adhesive layer 110 and the display element part 300 are referred to as a separation portion SP (dashed lower frame in FIG. 10).

In detail, as described previously with reference to FIG. 1, the graphene adhesive layer 110 has a relatively low adhesion force. Thus, when an external force is applied to the flexible substrate 200 and the carrier substrate 100 in opposite directions, respectively, the flexible substrate 200 and the carrier substrate 100 may be easily separated from each other without an additional process such as radiating a laser. For example, application of the external force may refer to pulling the fixing stage 500 and the fixing member 600 away from each other in opposite directions.

The area where the carrier substrate 100 directly contacts the flexible substrate 200 may be separated from the separation portion SP combined with the fixing stage 500 by the cutting portion CP. That is, as a strong bond is formed at an interface between the carrier substrate 100 and the flexible substrate 200, when the flexible substrate 200 and the carrier substrate 100 are pulled in opposite directions, the flexible substrate 200 is divided into the separation portion SP (that remains on the fixing stage 500) and a remaining portion RP (that remains on the carrier substrate 100 due to the strong bond at the interface between the carrier substrate 100 and the flexible substrate 200). The remaining portion RP may be combined with the carrier substrate 100.

The graphene adhesive layer 110 includes a plurality of the graphene oxide layers charged with different electric charges and alternately deposited. Thus, when a physical external force is applied to the graphene adhesive layer 110, an interlayer combination by Coulomb's force is broken, thereby causing interlayer separation. Thus, a first portion 110a of the graphene adhesive layer 110 may adhere to the flexible substrate 200 (i.e., may remain in the separation portion SP), and a second portion 110b of the graphene adhesive layer 110 may adhere to the carrier substrate 100 (i.e., may remain on the remaining portion RP) after the flexible substrate 200 is separated from the carrier substrate 100.

In an exemplary embodiment, before the flexible substrate 200 is separated from the carrier substrate 100 by an external force applied thereto in opposite directions, edges of the carrier substrate 100 and the flexible substrate 200 bend toward the fixing stage 500, so that the flexible substrate 200 may directly contact the fixing stage 500 (FIG. 9). Thus, the flexible substrate 200 may be adsorbed onto and combined with the fixing stage 500, and the external force applied to the fixing stage 500 may be directly applied to the flexible substrate 200. That is, when the external force is applied to the carrier substrate 100 and the flexible substrate 200 in opposite direction, the external force pulling the fixing stage 500 in a direction oriented away from the fixing member 600 pulls the fixing stage 500 directly from the flexible substrate 200.

If the external force were not directly applied to the flexible substrate 200 (via the fixing stage 500), the external force would be applied to the flexible substrate 200 through the display element part 300 and the protective film 400. Thus, when a large external force were to be applied to the flexible substrate 200 through the display element part 300 and the protective film 400, the protective film 400 would be separated from the display element part 300, thereby damaging to the display element part 300. In contrast, according to embodiments, since the external force is directly applied to the flexible substrate 200 from the fixing stage 500, the process of separating the carrier substrate 100 from flexible substrate 200 may be stably performed.

Figure 11:
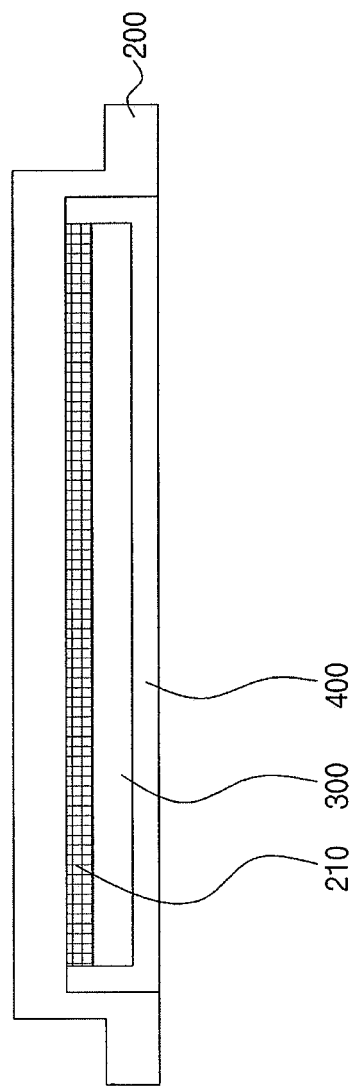

Referring to FIG. 11, the first portion 110a of the graphene adhesive layer 110 remaining on the flexible substrate 200 may be removed. For example, the first portion 110a of the graphene adhesive layer 10 may be removed by a wet method, e.g., using TMAH, or a dry method, e.g., using plasma or the like.

Figure 12:
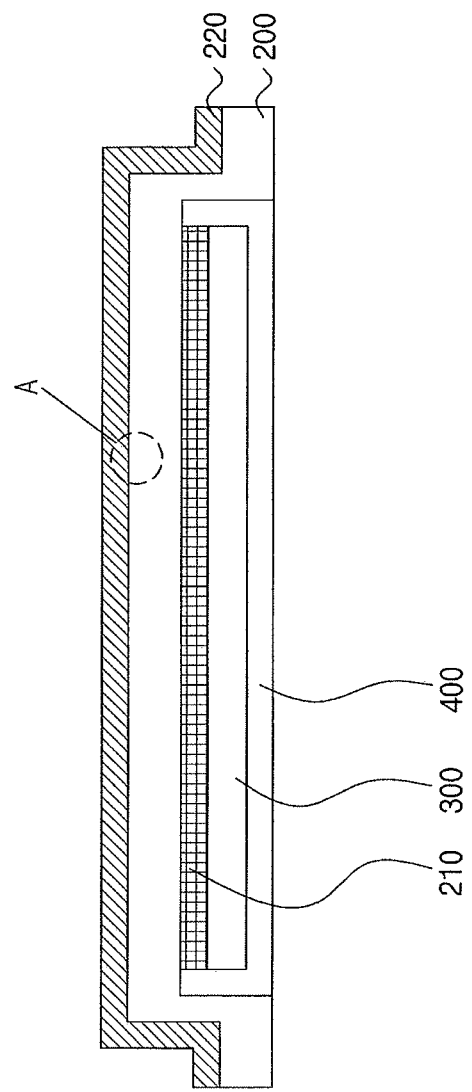
Figure 13:
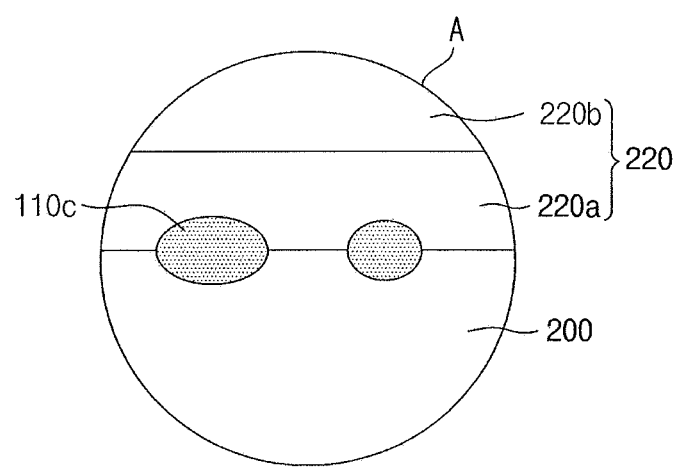
FIG. 13 illustrates an enlarged cross-sectional view of region 'A' of FIG. 12.

Referring to FIG. 12, a second barrier layer 220 is formed on a surface of the flexible substrate 200, from which the remaining portion 110a of the graphene adhesive layer is removed. For example, the second barrier layer 220 may include an inorganic material. For example, the inorganic material may include silicon oxide, silicon nitride, silicon oxynitride, silicon carbide, silicon oxycarbide or a combination thereof. The second barrier layer 220 may have a single-layer structure or a multi-layer structure including a plurality of layers including different materials.

Referring to FIG. 13, in an exemplary embodiment, the second barrier layer 220 may include an interfacial layer 220a and an outer layer 220b. The interfacial layer 220a may contact the flexible substrate 200, and the outer layer 220b may be formed on the interfacial layer 220a. The interfacial layer 220a may include silicon oxycarbide. Silicon oxycarbide has a relatively large flexibility and step coverage.

In detail, even after the process of removing the remaining portion 110a of the graphene adhesive layer 110 from the flexible substrate 200, a graphene oxide particle 110c may remain on the flexible substrate 200. Therefore, the interfacial layer 220a including silicon oxycarbide may planarize the flexible substrate 200 to prevent defects from being formed in the second barrier layer 220 by the remaining graphene oxide particle 110c.

In an exemplary embodiment, the outer layer 220b may have a substantially same configuration as the first barrier layer 210. For example, the outer layer 220b may include a multi-layer structure of silicon oxide ($SiO_2$)/silicon nitride (SiN)/silicon oxynitride (SiON). For example, a thickness of a silicon oxide layer may be about 2,000 angstroms to about 10,000 angstroms, a thickness of a silicon nitride layer may be about 100 angstroms to about 1,000 angstroms, and a thickness of a silicon oxynitride layer may be about 2,000 angstroms to about 10,000 angstroms.

Figure 14:
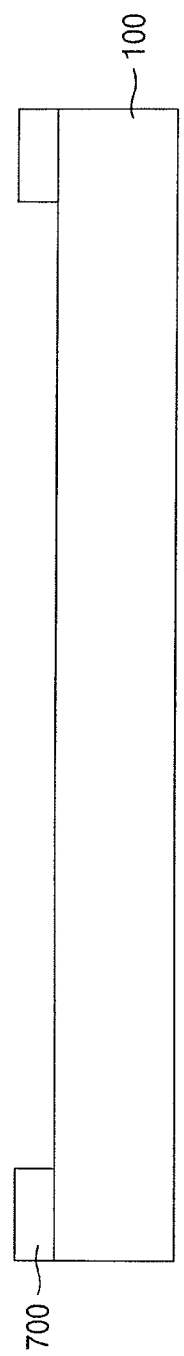
FIGS. 14 and 15 illustrate cross-sectional views of a process of forming a graphene adhesive layer in a method of manufacturing a flexible display device.
Figure 15:
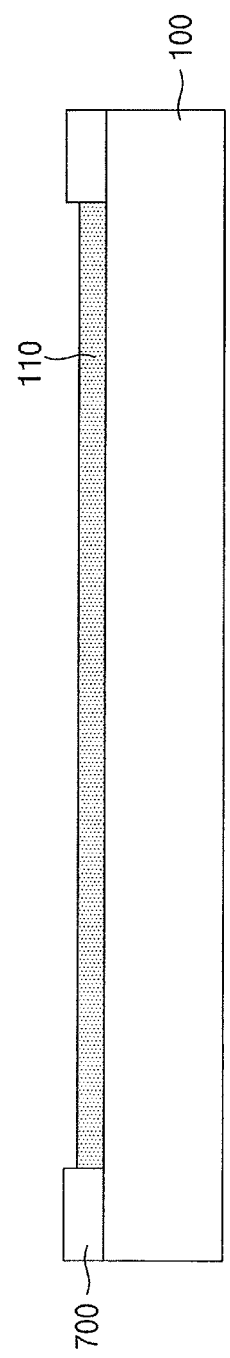

FIGS. 14 and 15 are cross-sectional views illustrating a process of forming the graphene adhesive layer 100 according to another embodiment in a method of manufacturing a flexible display device.

Referring to FIG. 14, a mask 700 is disposed on the carrier substrate 100. The mask 70 may be substantially the same as a mask used for forming an inorganic layer of a thin film encapsulation layer.

Referring to FIG. 15, the graphene adhesive layer 110 is formed on an upper surface of the carrier substrate 100, which is uncovered by the mask 700. In an exemplary embodiment, the graphene adhesive layer 110 may be formed through chemical vaporization deposition (CVD), e.g., plasma-enhanced chemical vaporization deposition (PECVD).

For example, a metal thin film including copper, nickel, iron or the like may be formed on the carrier substrate 100 in an area exposed by the mask 700. A carbon source, e.g., ethan, methane or the like, may be provided to the metal film on the carrier substrate 100 to form graphene. Thereafter, an oxygen plasma may be provided to the graphene to form the graphene adhesive layer 110 including a graphene oxide.

When the graphene adhesive layer 110 is formed by using the mask 700, a process of removing an edge of the graphene adhesive layer 110 from the carrier substrate 100 to expose an upper surface of the carrier substrate 100 is not necessary.

Furthermore, since a reaction temperature of PECVD may be equal to or higher than about 500° C., an additional baking process is not necessary, i.e., the baking process performed after removing an edge of the graphene adhesive layer 110 and described with reference to FIG. 2 may be eliminated. For example, a thickness of the graphene adhesive layer 110 may be about 0.3 nm to about 50 nm.

By way of summation and review, a method for separating a carrier substrate and a flexible substrate, i.e., a polymer substrate, from each other during manufacturing of a flexible display device may include use of a laser. However, when the laser is used for separating the carrier substrate from the flexible substrate, the display element part on the flexible substrate may be damaged, and separation uniformity may be reduced. Furthermore, an additional substrate may be required for forming a barrier layer on both surfaces of the flexible substrate.

In contrast, according to exemplary embodiments, a method of manufacturing a flexible display device provides improved reliability and efficiency. Exemplary embodiments also provide a flexible display device having improved reliability. That is, according to exemplary embodiments, a graphene adhesive layer is disposed between a carrier substrate and a flexible substrate. Thus, a chemical bond between the carrier substrate and the flexible substrate may be prevented, and the carrier substrate may be mechanically separated from the flexible substrate without a laser-radiation process or the like.

Further, an external force may be applied to the flexible substrate in the process of separating the carrier substrate from the flexible substrate. Thus, damage to a display element part may be prevented. Furthermore, after the carrier substrate is separated from the flexible substrate, a barrier layer may be added to an exposed surface of the flexible substrate, thereby increasing reliability of the flexible display device. Additionally, since a double-layer barrier may be formed on a single flexible substrate without an additional polyimide substrate, manufacturing cost may be decreased. Also, a silicon oxycarbide layer may be provided as an interfacial layer of the additional barrier layer to prevent defects due to remaining graphene oxide particles.

Exemplary embodiments may be applied to various display devices that may be used for, e.g., a television, a computer, a notebook computer, a tablet computer, a smart phone, a mobile phone, a navigator, a home appliance or the like.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A flexible display device, comprising:
    a flexible substrate;
    a first barrier layer on a first surface of the flexible substrate;
    a display element part on the first barrier layer; and
    a second barrier layer on a second surface of the flexible substrate opposite the first surface, the second barrier layer including:
        an interfacial layer including, silicon oxycarbide, the interfacial layer contacting the flexible substrate; and
        an outer layer including at least one of silicon oxide, silicon nitride, and silicon oxinitride, the outer layer being on the interfacial layer and spaced apart from the flexible substrate.

2. The flexible display device as claimed in claim 1, wherein the first barrier layer includes a multiple-layer structure of silicon oxide ($SiO_2$)/silicon nitride (SiN)/silicon oxynitride (SiON).

3. The flexible display device as claimed in claim 1, wherein the flexible substrate includes at least one of polyester, polyvinyl, polycarbonate, polyethylene, polypropylene, polyacetate, polyimide, polyethersulphone (PES), polyacrylate (PAR), polyethylenenaphthelate (PEN) and polyethyleneterephehalate (PET).

4. The flexible display device as claimed in claim 1, wherein the display element part includes:
    a pixel circuit;
    an organic light-emitting diode electrically connected to the pixel circuit; and
    a thin film encapsulation layer covering the organic light-emitting diode.

* * * * *